(12) United States Patent
Koh

(10) Patent No.: US 7,135,374 B2
(45) Date of Patent: Nov. 14, 2006

(54) MOS TRANSISTOR AND FABRICATION METHOD THEREOF

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 221 days.

(21) Appl. No.: 10/746,381

(22) Filed: Dec. 26, 2003

(65) Prior Publication Data

US 2005/0009354 A1 Jan. 13, 2005

(30) Foreign Application Priority Data

Jul. 11, 2003 (KR) .................. 10-2003-0047267

(51) Int. Cl.
*H01L 21/336* (2006.01)
(52) U.S. Cl. .............. 438/302; 438/300; 438/305
(58) Field of Classification Search .......... 438/305, 438/300, 302, 587, 149, 257, 283; 257/E21.151, 257/E21.206, E21.101, E21.444, E21.413
See application file for complete search history.

(56) References Cited

U.S. PATENT DOCUMENTS

| 5,516,711 A * | 5/1996 | Wang .................. 438/217 |
| 5,991,225 A | 11/1999 | Forbes et al. ........ 365/230.06 |
| 6,124,729 A | 9/2000 | Noble et al. ........... 326/41 |
| 6,153,468 A | 11/2000 | Forbes et al. ......... 438/257 |
| 6,171,916 B1 * | 1/2001 | Sugawara et al. ...... 438/303 |
| 6,346,732 B1 * | 2/2002 | Mizushima et al. .... 438/300 |
| 6,486,027 B1 | 11/2002 | Noble et al. ........... 438/259 |
| 6,597,037 B1 | 7/2003 | Forbes et al. .......... 257/330 |
| 2003/0001219 A1 * | 1/2003 | Chau et al. ............ 257/412 |
| 2005/0093021 A1 * | 5/2005 | Ouyang et al. ......... 257/194 |

FOREIGN PATENT DOCUMENTS

KR 2002-0045751 6/2002

OTHER PUBLICATIONS

Office Action issued by the Korean Patent Office for Korean Application No. 10-2003-0047267 and an English translation, Feb. 24, 2005, 2 pages.

* cited by examiner

*Primary Examiner*—Walter L. Lindsay, Jr.
(74) *Attorney, Agent, or Firm*—Andrew D. Fortney

(57) ABSTRACT

A method of forming a MOS transistor is disclosed. An example method forms an insulating film and a first silicon layer on a semiconductor substrate in order. The example method forms an impurity region by injecting impurity ions into a predetermined region of the first silicon layer, forms a common source line by forming a second silicon layer on the impurity region, and then injecting impurity ions into the second silicon layer. The example method also forms a gate oxide over whole surfaces of the first silicon layer and the common source line, forms side walls made of insulating film on the gate oxide film positioned at sides of the common source line, forms drain regions by injecting impurity ions into the first silicon layer being positioned at a predetermined distance from the common source line, and forms gate electrodes on sides of the side walls.

13 Claims, 4 Drawing Sheets

MOS TRANSISTOR AND FABRICATION METHOD THEREOF

FIELD OF THE DISCLOSURE

The present disclosure relates generally to semiconductor devices and, more particularly, to a method of fabricating a MOS transistor.

BACKGROUND

In general, it necessarily requires short channel length, reduction of contact depths of a source and a drain, and reduction of effective gate oxide thickness to attain high power performance, high efficiency integration, and high speed operation characteristics. The development of vertical transistors has increased with the downsizing of the semiconductor devices. Examples of known vertical transistors are disclosed in U.S. Pat. Nos. 6,597,037, 6,486,027 6,153,468, 6,124,729, and 5,991,225.

Device performance increases should be attained by means of increase of driving current and reduction of leakage current. However, in a conventional process, there are some problems associated with fabricating a fine silicon device having such high performance. For example, although it is necessary to use new patterning techniques, such as electron beam or X-ray exposure-based techniques, of forming ultra fine patterns to fabricate nano-size channels as a conventional planar structure, because such techniques are not established until today, it is not currently possible to mass produce ultra fine silicon devices requiring ultra fine patterns.

DETAILED DESCRIPTION

Figure 1A:
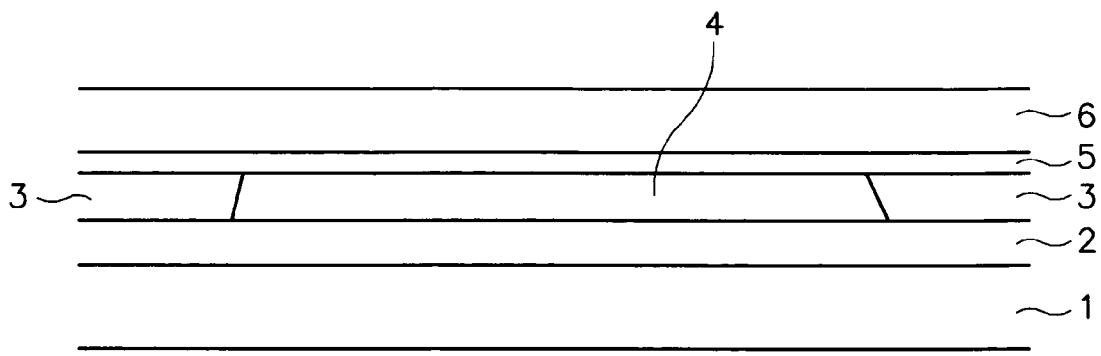
FIGS. 1a to 1i are sectional views showing an example method of fabricating an example MOS transistor.

As described in greater detail below, an example ultra fine MOS transistor having nano-size fine channels formed between a common source line of a highly doped silicon layer and both drains without additional lithography processes so that two channels capable of being individually controlled in the same sized device are formed.

One example method forms an insulating film and a first silicon layer on a semiconductor substrate in order, forms an impurity region by injecting impurity ions into a predetermined region of the first silicon layer, forms a common source line by forming a second silicon layer on the impurity region, and then injecting impurity ions into the second silicon layer. In addition, the example method forms a gate oxide over whole surfaces of the first silicon layer and the common source line, forms side walls made of insulating film on the gate oxide film positioned at sides of the common source line, forms drain regions by injecting impurity ions into the first silicon layer being positioned at a predetermined distance from the common source line; and forming gate electrodes on sides of the side walls.

Herein, when injecting impurity ions, a sacrificial or victim layer is formed on the first silicon layer, a portion of the victim layer is etched to expose the first silicon layer below the portion at which a common source line is to be formed later, and then impurity ions are injected into the exposed first silicon layer to form the impurity region. At this time, it is desirable that the second silicon layer is formed of any one of a polysilicon layer and a silicon epitaxial layer.

It is also desirable that the victim layer is removed after injecting the impurity ions into the second silicon layer and that the victim layer is formed by depositing a nitride film and an oxide film are deposited in order, and then the oxide film and the nitride film are wet-etched away in order when the victim layer is removed.

Further, it is desirable that, in forming the side walls, a nitride film is formed on the gate oxide, and then the nitride film is etched back until the gate oxide on a top surface of the common source line is exposed in order to form the side walls formed of remainder nitride film on the gate oxide positioned at sides of the common source line.

It is also desirable that, in forming the drain regions, a masking film is formed on the gate oxide and the side walls, the masking film covering the common source line and having a larger width than the common source line, and then impurity ions are injected into the first silicon layer using the masking film as a mask.

It is desirable that, in forming the gate electrodes, a polysilicon layer and a nitride layer are formed in order over whole surfaces of the gate oxide and the side walls, the nitride film and the polysilicon layer are etched back until the gate oxide on a top surface of the common source line is exposed, thereby enabling the nitride film and the polysilicon layer on sides of the side walls to remain, and then the remainder nitride film is removed using wet etching.

It is also desirable that, after forming the gate electrodes, a PMD (pre-metal dielectric) is formed over whole surfaces above a substrate, contact holes are formed to expose predetermined regions of the common source line and drain by selectively etching the PMD, and metallic material is buried inside the contact holes.

In burying the metallic material inside the contact holes, Ti/TiN barrier, metal films are formed at inner walls of the contact holes, and then tungsten is formed on the barrier metal films, thereby burying the contact holes.

Figure 1B:
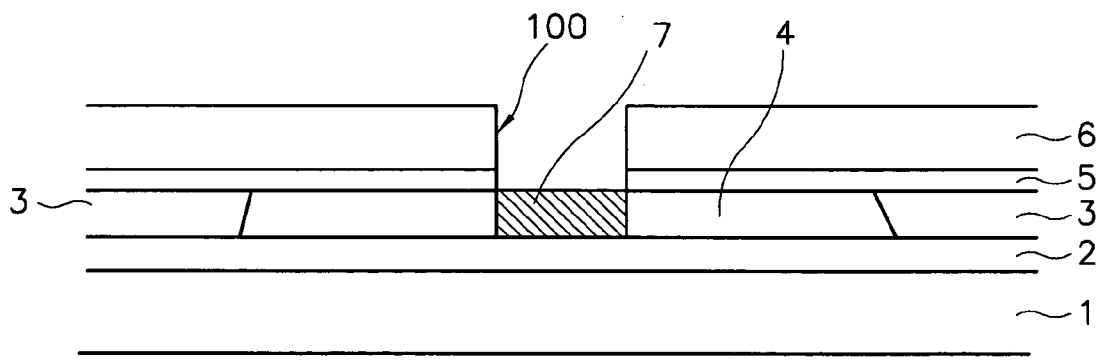
Figure 1C:
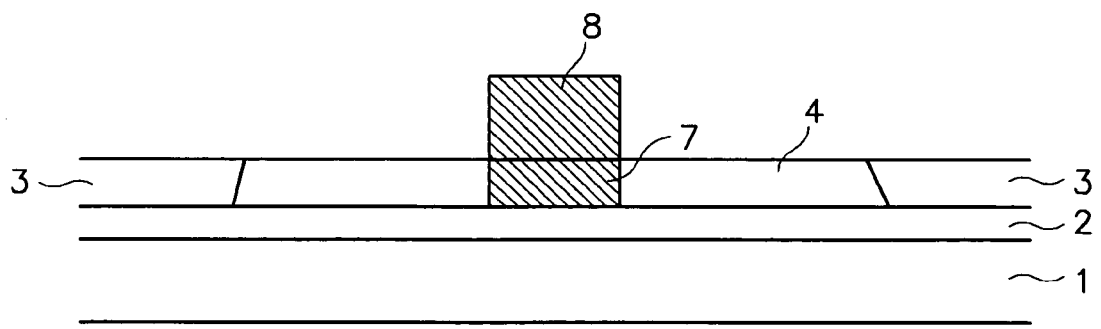
Figure 1D:
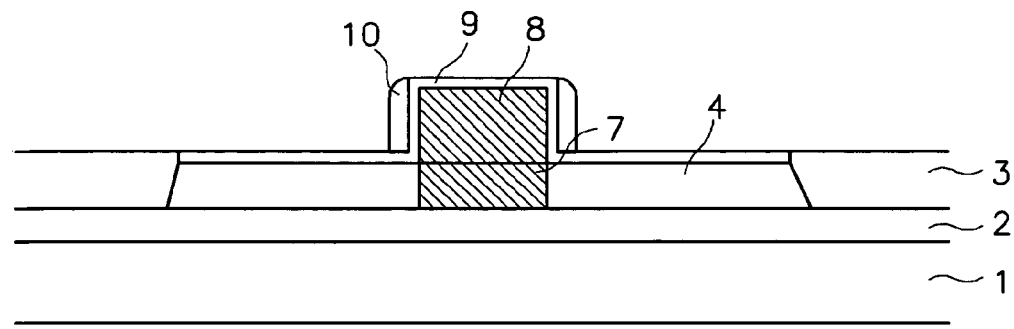
Figure 1E:
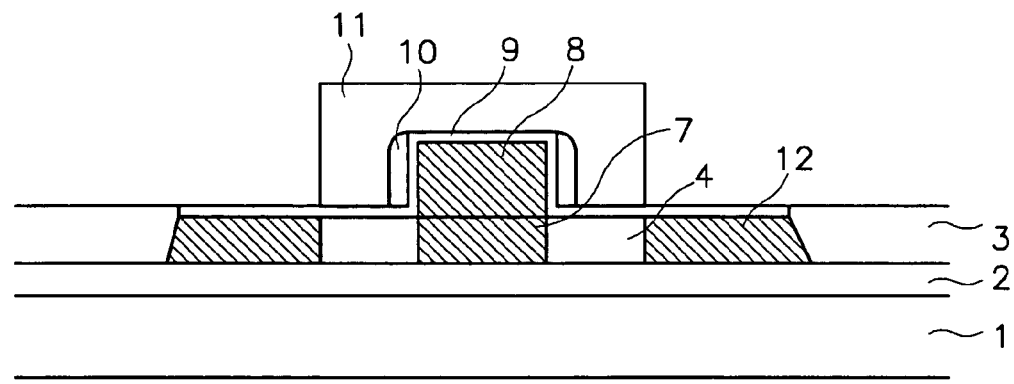
Figure 1F:
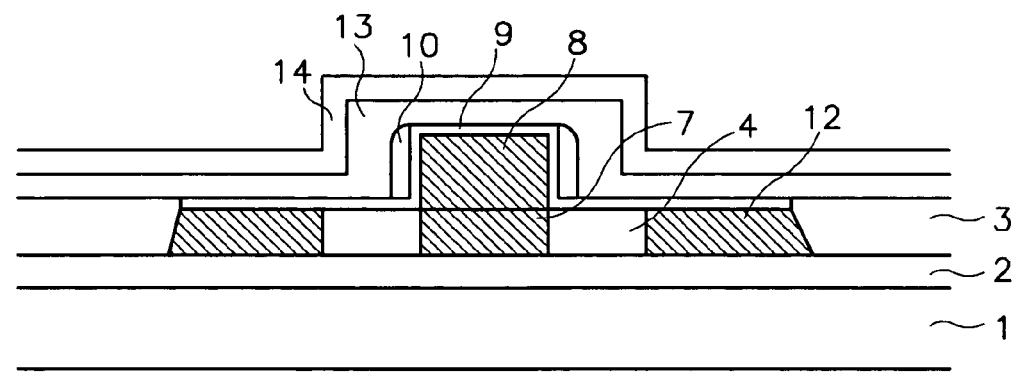
Figure 1G:
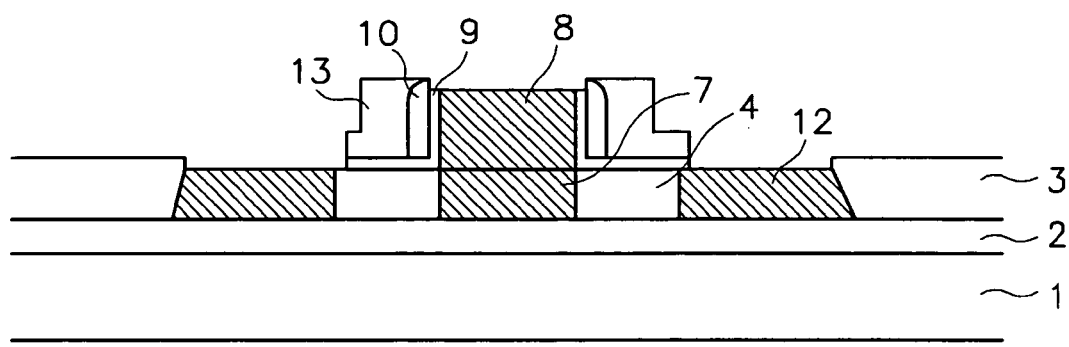
Figure 1H:
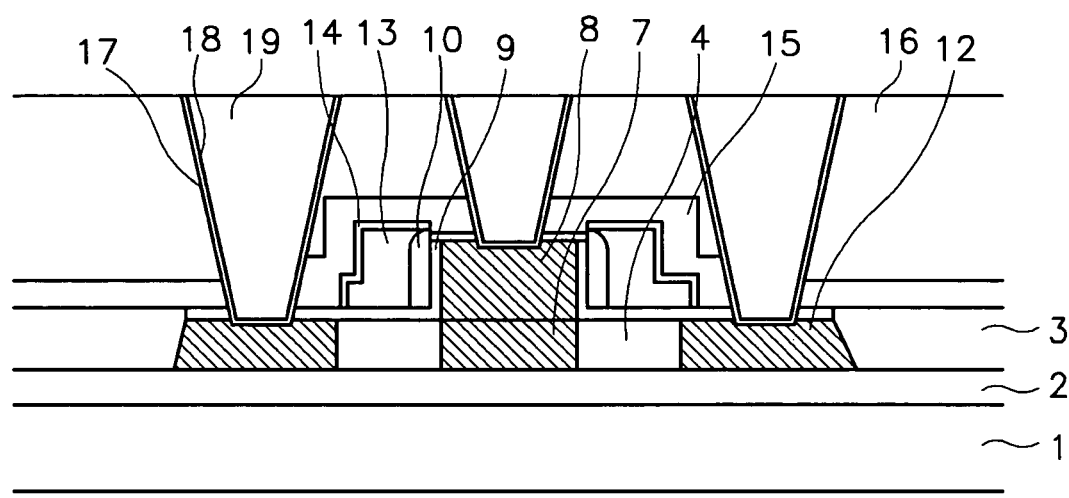
Figure 1I:
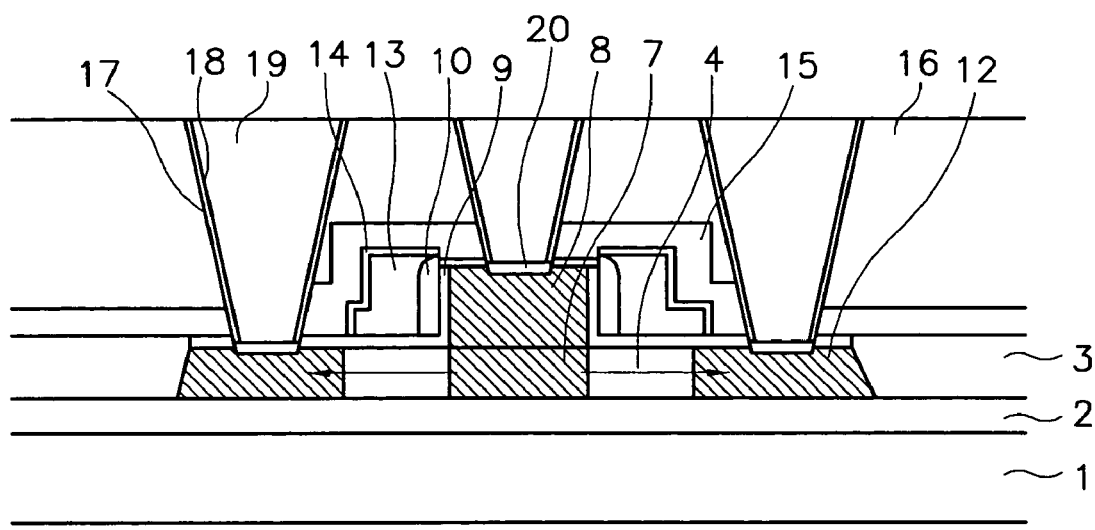

FIGS. 1a to 1i are sectional views showing an example method of fabricating a MOS transistor. As shown in FIG. 1i, the MOS transistor is formed on a first silicon layer 4, which functions as an active region thereof and is formed on a predetermined region of an insulating film 2 formed on a semiconductor substrate 1. At this time, the first silicon layer 4, so called SOI (Silicon On Insulator), has trenches 3, in which insulating material is buried, the trench functioning as an isolator.

An impurity region 7 is formed by injecting impurity ions into a first predetermined region of the first silicon layer 4, and a common source line 8 formed of a second silicon layer into which impurity ions are injected is formed on the impurity region 7. The second silicon layer may be formed of polysilicon layer or silicon epitaxial layer.

A gate oxide 9 is formed over whole surfaces of the common source line 8 and the first silicon layer 4, and side walls 10 formed of insulating films, e.g., nitride films are formed on the gate oxide positioned at sides of the common source line 8.

Drain regions are formed by injecting impurity ions into second predetermined regions of the first silicon layer 4, the second predetermined regions being positioned at a distance from the common source line 8, and gate electrodes 13 are formed on sides of the side walls 10.

As a result, the gate electrodes 13 and the drain regions 12 are formed in each side direction with respect to the common source line 8, thereby forming a pair.

PMD (Pre-Metal Dielectric) 16 is formed over whole surfaces of the gate electrodes 13, the side walls 10, and the common source line 8, and then the PMD 16 is selectively etched away to form contact holes 17, which exposes predetermined regions of the common source line 8 and the drain regions 12.

The PMD 16 may be formed on an insulating film 15 previously formed before forming the PMD 16.

Barrier metal films 18 of Ti/TiN structure are formed on inner walls of the contact holes 17, and then metallic material 19 such as tungsten is formed on the barrier metal films 18, thereby burying the contact holes 17.

Silicides are formed on top surfaces of the common source line 8 and the drain regions 12 facing the contact holes 17.

In the above-described MOS transistor, when reasonable voltage is applied to the gate electrodes 13 positioned at each side of the common source line 8 in operation, as shown in FIG. 1i, channels are formed in the first silicon layer 4 positioned at each side of the common source line 8 with current flowing from the common source line 8 to each drain regions 12. At this time, it is possible to separately adjust current flow to each of the drain regions 12 by controlling the voltage applied to each of the gate electrodes 13. For example, it is possible that current flow to right drain region is blocked to be in an OFF state and current flow to left drain region is not blocked and, thus, is in an ON state.

An example method of fabricating the MOS transistor is described in detail below. First, as shown in FIG. 1a, a first insulating film 2 and a first silicon layer 4 are formed in order on a semiconductor substrate 1, and then the first silicon layer 4 is selectively etched away to form trenches 3 and bury insulating material therein.

Then, the trenches 3 buried with the insulating material function as isolator between devices, and the first silicon layer 4 becomes active regions of devices.

At this time, the first silicon layer 4 which becomes the active regions of the devices is so called SOI (Silicon On Insulator). Subsequently, a second insulating film 5 is deposited over whole surfaces including the first silicon layer 4 and the trenches 3 above the semiconductor substrate 1, and then an oxide 6 is deposited on the second insulating film 5.

Herein, the second insulating film 5 and the oxide 6 function as a sacrificial or victim layer to form a common source line later.

Next, as shown in FIG. 1b, a photoresist is applied on the oxide 6, and exposed thereto and developed to form a photoresist pattern (not shown) exposing a predetermined region of the oxide 6 on which a common source line is to be formed later. Then, the oxide 6 and the second insulating layer 5 below it are etched away using the photoresist pattern as a mask, and then impurity ions are injected into the exposed predetermined region of the first silicon layer 4 through the etching process, thereby forming an impurity region 7.

Next, as shown in FIG. 1c, polysilicon or silicon epitaxial layer are grown on the impurity region 7 to form a second silicon layer 8, and then impurity ions are also injected into the second silicon layer 8 to form a common source line.

Subsequently, the victim layer of the oxide 6 and the second insulating film 5 are wet-etched away in order.

Next, as shown in FIG. 1d, gate oxide 9 is deposited over whole surfaces including the second silicon layer 8 and the first silicon layer 4 above the semiconductor substrate 1.

Subsequently, a nitride film is deposited on the gate oxide 9, and then the nitride film is etched back until the gate oxide 9 on the second silicon layer 8 is exposed in order to make nitride film on the gate oxide 9 positioned at only sides of the second silicon layer 8 remain, thereby forming side walls 10.

Next, as shown in FIG. 1e, a masking film 11 is formed on the gate oxide 9 and the side walls 10, the masking film covering the second silicon layer 8 and having a larger width than the second silicon layer 8, and then impurity ions are injected into the exposed first silicon layer using the masking film 11 as a mask, thereby forming drain regions 12.

Then, as shown in FIG. 1f, a polysilicon layer 13 and an oxide 14 are formed to form a gate electrode.

Next, as shown in FIG. 1g, the oxide 14 and the polysilicon layer 13 are etched back until the gate oxide 9 on the second silicon layer 8 is exposed in order to make the polysilicon layer 13 on only the side walls 10 remain, thereby forming gate electrodes. Then, the oxide 14 is wet-etched away.

In the wet-etching process of the oxide 14, the gate oxide 9 on the second silicon layer 8 and the gate oxide 9 on the first silicon layer 12 not covered with the polysilicon layer 13 are removed simultaneously.

As a result, the gate electrodes have a folded shape over the side walls 10 and the second silicon layer 8.

Next, as shown in 1h, in order to compensate the damaged oxide, thin oxide is formed over whole surface of the structure, and then an insulating film 15 is deposited and a PMD 16 is deposited thickly.

Subsequently, the PMD 16 and the insulating film 15 are selectively etched away to form contact holes 17 exposing predetermined regions of the polysilicon layer 13, the second silicon layer 8 of the common source line, and the drain regions 12. Then, barrier metal films 18 having a laminated structure of Ti and TiN are formed at inner walls of the contact holes 17, and then tungsten 19 is deposited on the barrier metal films 18 to bury the contact holes 17.

Next, as shown in 1i, by performing heat treatment, Ti of the barrier metal film is reacted with silicon so that suicides 20 are formed on top surfaces of the second silicon layer 8 and the drain regions 12.

As described above, an ultra fine MOS transistor where nano-size fine channels are formed respectively between a common source line of high doped silicon layer and both drains without additional lithography processes so that two channels capable of individually being controlled in the same sized device are formed, and a method of fabricating the same are provided.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of forming a MOS transistor, comprising:
   forming an insulating film and a first silicon layer on a semiconductor substrate in order;
   after forming the first silicon layer, forming a trench by selectively etching the first silicon layer and burying insulating material inside thereof to define remainder regions of the first silicon layer as active region of a semiconductor device;
   forming an impurity region by injecting inpurity ions into a predetermined region of the first silicon layer;
   forming a common source line by forming a second silicon layer on the impurity region, and then injecting impurity ions into the second silicon layer;
   forming a gate oxide over whole surfaces of the first silicon layer and the common source line;

forming side walls made of insulating film on the gate oxide film positioned at sides of the common source line;

forming drain regions by injecting impurity ions into the first silicon layer being positioned at a predetermined distance from the common source line; and forming gate electrodes on sides of the side walls.

2. The method of claim 1, wherein the second silicon layer comprises at least one of a polysilicon layer and a silicon epitaxial layer.

3. A method of forming a MOS transistor, comprising:

forming an insulating film and a first silicon layer on a semiconductor substrate in order;

forming an impurity region by injecting impurity ions into a predetermined region of the first silicon layer by forming a victim layer on the first silicon layer, etching a portion of the victim layer to expose the first silicon layer below the portion at which a common source line is to be formed later, and then injecting impurity ions into the exposed first silicon layer to form the impurity region;

forming a common source line by forming a second silicon layer on the impurity region, and then injecting impurity ions into the second silicon layer;

forming a gate oxide over whole surfaces of the first silicon layer and the common source line;

forming side walls made of insulating film on the gate oxide film positioned at sides of the common source line;

forming drain regions by injecting impurity ions into the first silicon layer being positioned at a predetermined distance from the common source line; and forming gate electrodes on sides of the side walls.

4. The method of claim 3, wherein the second silicon layer comprises at least one of a polysilicon layer and a silicon epitaxial layer.

5. The method of claim 3, further comprising the step at removing the victim layer after injecting the impurity ions into the second silicon layer.

6. The method of claim 5, wherein the victim layer comprises a nitride film and an oxide film in order.

7. The method of claim 6, wherein removing the victim layer comprises wet etching the oxide film and the nitride film in order.

8. A method of forming a MOS transistor, comprising:

forming an insulating film and a first silicon layer on a semiconductor substrate in order;

forming an impurity region by injecting ions into a predetermined region of the first silicon layer;

forming a common source line by forming a second silicon layer on the impurity region, and then injecting impurity ions into the second silicon layer;

forming a gate oxide over whole surfaces of the first silicon layer and the common source line;

forming a nitride film on the gate oxide, and then etching the nitride film until the gate oxide on a top surface of the common source line is exposed to form side walls at sides of the common source line;

forming drain regions by injecting impurity ions into the first silicon layer being positioned at a predetermined distance from the common source line; and forming gate electrodes on sides of the side walls.

9. The method of claim 8, wherein the second silicon layer comprises at least one of a polysilicon layer and a silicon epitaxial layer.

10. A method of forming a MOS transistor, comprising:

forming an insulating film and a first silicon layer on a semiconductor substrate in order;

forming an impurity region by injecting impurity ions into a predetermined region of the first silicon layer;

forming a common source line by forming a second silicon layer on the impurity region, and then injecting impurity ions into the second silicon layer;

forming a gate oxide over whole surfaces of the first silicon layer and the common source line;

forming side walls made of insulating film on the gate oxide film positioned at sides of the common source line;

forming drain regions by forming a masking film on the gate oxide and the side walls, the masking film covering the common source line and having a larger width than the common source line, and then injecting impurity ions into the first silicon layer a predetermined distance from the common source line using the masking film as a mask; and forming gate electrodes on sides of the side walls.

11. The method of claim 10, wherein the second silicon layer comprises at least one of a polysilicon layer and a silicon epitaxial layer.

12. A method of forming a MOS transistor, comprising:

forming an insulating film and a first silicon layer on a semiconductor substrate in order;

forming an impurity region by injecting impurity ions into a predetermined region of the first silicon layer;

forming a common source line by forming a second silicon layer on the impurity region, and then injecting impurity ions into the second silicon layer;

forming a gate oxide over whole surfaces of the first silicon layer and the common source line;

forming side walls made of insulating film on the gate oxide film positioned at sides of the common source line;

forming drain regions by injecting impurity ions into the first silicon layer being positioned at a predetermined distance from the common source line; and forming gate electrodes on sides of the side walls by forming a polysilicon layer and a nitride layer in order over whole surfaces of the gate oxide and the side walls, etching back the nitride film and the polysilicon layer until the gate oxide on a top surface of the common source line is exposed, thereby making the nitride film and the polysilicon layer on sides of the side walls remain, and then removing the remainder nitride film using wet etching.

13. The method of claim 12, wherein the second silicon layer comprises at least one of a polysilicon layer and a silicon epitaxial layer.

* * * * *